US012796380B2

(12) United States Patent
Ideguchi

(10) Patent No.: US 12,796,380 B2
(45) Date of Patent: Nov. 10, 2026

(54) SEMICONDUCTOR MANUFACTURING APPARATUS AND METHOD FOR CONTROLLING OPERATION OF SEMICONDUCTOR MANUFACTURING APPARATUS

(71) Applicant: EBARA CORPORATION, Tokyo (JP)

(72) Inventor: Kazuma Ideguchi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 369 days.

(21) Appl. No.: 18/527,118

(22) Filed: Dec. 1, 2023

(65) Prior Publication Data

US 2024/0203768 A1 Jun. 20, 2024

(30) Foreign Application Priority Data

Dec. 19, 2022 (JP) ................................ 2022-202066

(51) Int. Cl.

*H10P 72/00* (2026.01)
*H10P 74/00* (2026.01)
*H10P 14/46* (2026.01)

(52) U.S. Cl.

CPC ...... *H10P 72/0612* (2026.01); *H10P 72/0604* (2026.01); *H10P 74/232* (2026.01); *H10P 14/46* (2026.01); *H10P 72/0476* (2026.01)

(58) Field of Classification Search

USPC ........................................................ 700/121
See application file for complete search history.

(56) References Cited

U.S. PATENT DOCUMENTS

2008/0051929 A1* 2/2008 Hongkham ......... H10P 72/0612 700/214
2021/0124341 A1* 4/2021 Nakasato ........... G05B 23/0221
2022/0206467 A1* 6/2022 Seo .......................... G05B 9/03
2024/0120225 A1* 4/2024 Shindo ................ H10P 72/0402

FOREIGN PATENT DOCUMENTS

JP 5620680 B2 * 11/2014 ............. H01L 21/68

* cited by examiner

*Primary Examiner* — Emilio J Saavedra
(74) *Attorney, Agent, or Firm* — BakerHostetler

(57) ABSTRACT

When a failure has occurred in a semiconductor manufacturing apparatus, lowering of throughput thereof is suppressed. A method for controlling operation of a semiconductor manufacturing apparatus, which comprises one or plural processing modules and each processing module comprises plural submodules, comprises steps for: judging whether a failure has occurred in at least one of the plural submodules; judging whether at least one submodule which is not in a failed state exists in a processing module to which the failed submodule belongs; obtaining throughput in a state that the one or plural processing modules are controlled to perform operation while the failed submodule is controlled to stop its operation; judging whether the throughput is larger than a predetermined threshold; and continuing operation of the one or plural processing modules while controlling the failed submodule to stop its operation, in the case that the throughput is larger than the predetermined threshold.

9 Claims, 8 Drawing Sheets

Fig. 7

| Failure modes | Time required for restoration |
| --- | --- |
| Failure mode 1 | 3 hours |
| Failure mode 2 | 2 hours |
| Failure mode 3 | 8 hours |
| Failure mode 4 | 6 hours |
| …… | …… |

SEMICONDUCTOR MANUFACTURING APPARATUS AND METHOD FOR CONTROLLING OPERATION OF SEMICONDUCTOR MANUFACTURING APPARATUS

TECHNICAL FIELD

The present invention relates to a semiconductor manufacturing apparatus and an operation controlling method of a semiconductor manufacturing apparatus. Especially, the present invention relates to controlling performed when a failure has occurred in a semiconductor manufacturing apparatus.

BACKGROUND ART

A semiconductor manufacturing apparatus comprises plural processing modules which perform processes peculiar to them, respectively. Further, a processing module may comprise plural submodules. In the case that a failure has occurred in one of submodules, it is necessary to stop operation of the whole of a semiconductor manufacturing apparatus, and perform restoration work such as replacing of a part which is the cause of the failure, and so on. Accordingly, downtime occurs in the semiconductor manufacturing apparatus. In this regard, although it is possible to stop a submodule in which a failure has occurred and continue operation of the semiconductor manufacturing apparatus for avoiding occurrence of downtime, the throughput in the semiconductor manufacturing apparatus is lowered in such a case.

CITATION LIST

Patent Literature

PTL 1: Japanese Patent Publication No. 5620680

SUMMARY OF INVENTION

Technical Problem

It is desired to suppress lowering of the throughput as much as possible when a failure has occurred.

Solution to Problem (Mode 1) According to mode 1, a method for controlling operation of a semiconductor manufacturing apparatus, which comprises one or plural processing modules which respectively comprise plural submodules, is provided, and the method comprises steps for: judging whether a failure has occurred in at least one of the plural submodules; judging, in the case that a failure has occurred in at least one of the plural submodules, whether at least one submodule which is not in a failed state exists in a processing module to which the failed submodule belongs; obtaining, in the case that at least one submodule which is not in a failed state exists in the processing module to which the failed submodule belongs, throughput in a state that the one or plural processing modules are controlled to perform operation while the failed submodule is controlled to stop its operation; judging whether the throughput is larger than a predetermined threshold; and continuing operation of the one or plural processing modules while controlling the failed submodule to stop its operation, in the case that the throughput is larger than the predetermined threshold.

(Mode 2) According to mode 2 comprising the method in mode 1, the method comprises a step for stopping operation of the whole semiconductor manufacturing apparatus for restoration from the failure, in the case that the throughput is smaller than the predetermined threshold.

(Mode 3) According to mode 3 comprising the method in mode 1, the threshold value is calculated based on restoration time that is defined in advance with respect to each of failure modes.

(Mode 4) According to mode 4 comprising the method in mode 3, the threshold value is calculated by adjusting, based on a ratio between the length of a predetermined judgment period and the length of restoration time corresponding to the occurred failure, a value of throughput before occurrence of a failure.

(Mode 5) According to mode 5 comprising the method in mode 4, the predetermined judgment period is a period relating to maintenance that is periodically performed with respect to the semiconductor manufacturing apparatus.

(Mode 6) According to mode 6 comprising the method in mode 1, the step for obtaining throughput in a state that the one or plural processing modules are controlled to perform operation while the failed submodule is controlled to stop its operation comprises steps for: creating a schedule for processing of plural objects by the semiconductor manufacturing apparatus, on the supposition that the one or plural processing modules are controlled to perform operation while the failed submodule is controlled to stop its operation; and calculating the throughput based on the created schedule, wherein the throughput represents the number of the objects with respect to which processing applied thereto in the semiconductor manufacturing apparatus is to be completed within unit time.

(Mode 7) According to mode 7 comprising the method in mode 1, the method further comprises a step for communicating an alarm that represents a state that operation of the one or plural processing modules is continued while the failed submodule is controlled to stop its operation.

(Mode 8) According to mode 8 comprising the method in mode 1, the method further comprises a step for selecting, based on a predetermined condition, whether the step for continuing is to be performed.

(Mode 9) According to mode 9 comprising the method in mode 1, the processing module is a plating module comprising plural plating tanks; and the submodules are the plating tanks.

(Mode 10) According to mode 10, a semiconductor manufacturing apparatus is provided, and the semiconductor manufacturing apparatus comprises: one or plural processing modules, wherein each processing module comprises plural submodules; and a controller constructed to control operation of the one or plural processing modules in accordance with the method in any one of modes 1-9.

BRIEF DESCRIPTION OF DRAWINGS

FIG. 7 is a table showing examples of time $t_k$ required for restoration.

DESCRIPTION OF EMBODIMENTS

In the following description, embodiments of the present invention will be explained with reference to the figures. In the figures which will be explained below, a reference symbol that is the same as that assigned to one component is assigned to the other component which is the same as or corresponds to the one component, and overlapping explanation of these components will be omitted.

Figure 1:
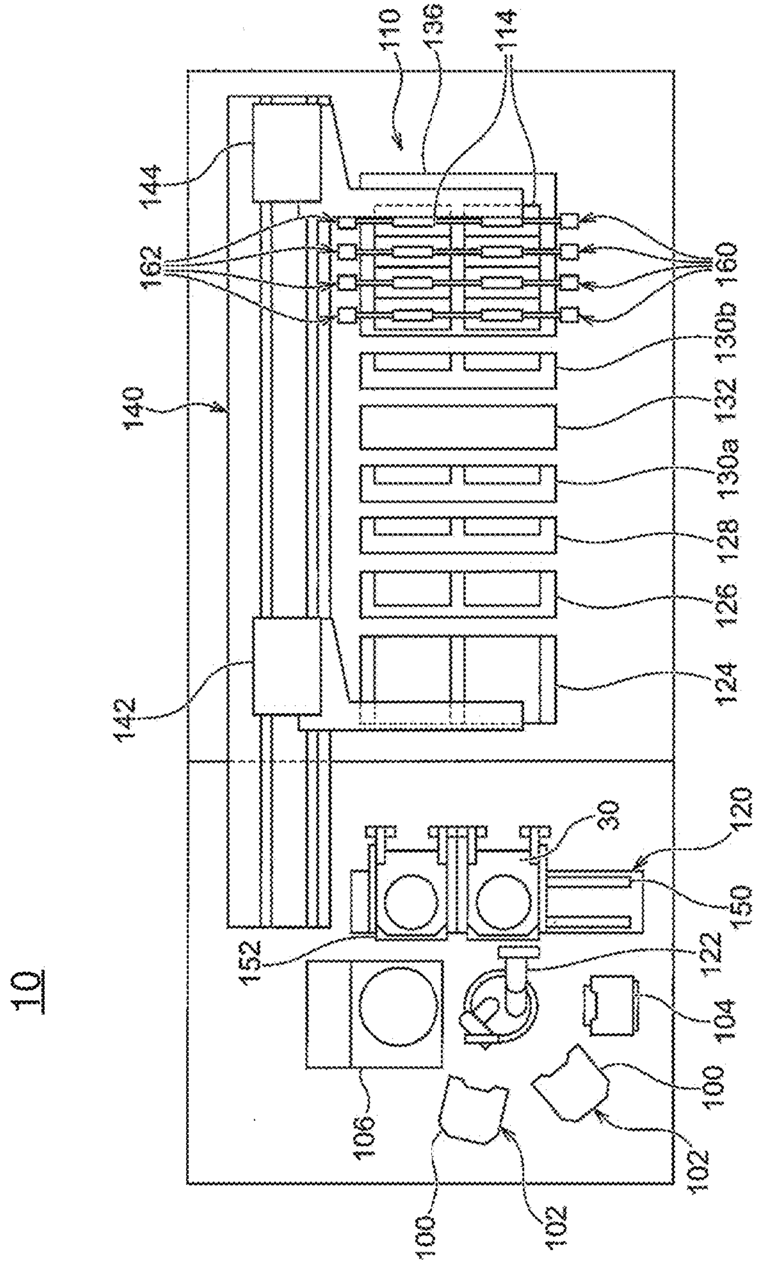
FIG. 1 is a general layout drawing of a plating apparatus to which a method according to an embodiment of the present invention is applicable.

FIG. 1 is a general layout drawing of a plating apparatus 10 to which a method according to an embodiment of the present invention is applicable. The plating apparatus 10 is an example of a semiconductor manufacturing apparatus. Although an embodiment of the present invention will be explained by referring to the plating apparatus 10 in the following description, the method according to the embodiment of the present invention can be applied to semiconductor manufacturing apparatuses other than a plating apparatus (for example, a CMP (Chemical Mechanical Polishing) apparatus and so on).

As shown in FIG. 1, the plating apparatus 10 comprises: two cassette tables 102; an aligner 104 for aligning, in a predetermined direction, a position of an orientation flat, a notch, or the like of a substrate; and a spin rinse dryer 106 for drying, after completion of a plating process of a substrate, the substrate by rotating it at high speed. A cassette 100, in which a substrate such as a semiconductor wafer or the like is housed, is loaded onto the cassette table 102. A load/unload station 120, onto which a substrate holder 30 is loaded to attach/detach a substrate thereto/therefrom, is installed in a position close to the spin rinse dryer 106. In a position in the center of the above units 100, 104, 106, and 120, a transfer robot 122 which carries a substrate between the above units is arranged.

The load/unload station 120 comprises loading plates 152, wherein each loading plate 152 has a flat plate shape and is able to slide in a lateral direction along rails 150. Two substrate holders 30 are loaded, in parallel with each other in a horizontal state, onto the loading plates 152; and, after completion of delivery of a substrate between one of the substrate holders 30 and the transfer robot 122, the loading plates 152 are slid in a lateral direction, and delivery of a substrate between the other of the substrate holders 30 and the transfer robot 122 is performed.

The plating apparatus 10 further comprises a stocker 124, a pre-wet module 126, a pre-soak module 128, a first rinse module 130*a*, a blow module 132, a second rinse module 130*b*, and a plating module 110. In the stocker 124, storing and temporary storing of a substrate holder 30 is performed. In the pre-wet module 126, a substrate is soaked in pure water. In the pre-soak module 128, an oxide film on a surface of an electrically conducting layer such as a seed layer or the like formed on a surface of a substrate is removed by etching. In the first rinse module 130*a*, a substrate is rinsed together with a substrate holder 30 by using a cleaning solution (pure water or the like) after pre-soaking. In the blow module 132, liquid removal of a substrate is performed after rinsing. In the second rinse module 130*b*, a plated substrate is rinsed together with a substrate holder 30 by using a cleaning solution. The load/unload station 120, the stocker 124, the pre-wet module 126, the pre-soak module 128, the first rinse module 130*a*, the blow module 132, the second rinse module 130*b*, and the plating module 110 are arranged in the above listed order.

For example, the plating module 110 is constructed in such a manner that plural plating tanks 114 are housed in the inside of an overflow tank 136. In the example of FIG. 1, the plating module 110 comprises eight plating tanks 114. Each plating tank 114 is constructed in such a manner that it receives a single substrate in the inside thereof, soaks the substrate in plating liquid held in the inside thereof, and applies plating such as copper plating or the like to a surface of the substrate. The plating module 110 is an example of a "processing module," and the plating tank 114 is an example of a "submodule." The plating module 110 (the processing module) comprises plural plating tanks 114 (submodules).

The plating apparatus 10 comprises a transfer apparatus 140 which is arranged in a position on a side of the above respective devices, adopts, for example, a linear motor system, and conveys a substrate holder 30, together with a substrate, between the above respective devices. The transfer apparatus 140 comprises a first transfer apparatus 142 and a second transfer apparatus 144. The first transfer apparatus 142 is constructed to convey a substrate between the load/unload station 120, the stocker 124, the pre-wet module 126, the pre-soak module 128, the first rinse module 130*a*, and the blow module 132. The second transfer apparatus 144 is constructed to convey a substrate between the first rinse module 130*a*, the second rinse module 130*b*, the blow module 132, and the plating module 110. The plating apparatus 10 may be constructed in such a manner that it does not comprise the second transfer apparatus 144, i.e., it comprises the first transfer apparatus 142 only.

In positions on both sides of the overflow tank 136, paddle drivers 160 and paddle followers 162 are arranged, wherein each of the paddle drivers 160 and each of the paddle followers 162 drive a paddle which is arranged in each of the plating tanks 114 and works as a stirring rod for stirring plating liquid in the plating tank 114.

An example of a series of plating processes performed by the plating apparatus 10 will be explained. First, a substrate is taken out by the transfer robot 122 from the cassette 100 loaded on the cassette table 102, and the substrate is conveyed to the aligner 104. The aligner 104 aligns, in a predetermined direction, a position of an orientation flat, a notch, or the like. The substrate, that has been aligned with respect to the direction by the aligner 104, is conveyed by the transfer robot 122 to the load/unload station 120.

Regarding the load/unload station 120, two substrate holders 30, which have been stored in the stocker 124, are gripped at the same time by the first transfer apparatus 142 in the transfer apparatus 140, and conveyed to the load/unload station 120. Thereafter, the two substrate holders 30 are put, at the same time and horizontally, on the loading plates 152 in the load/unload station 120. In the above state, the transfer robot 122 conveys the substrates to the substrate holders 30, respectively, and the conveyed substrates are held in the substrate holders 30, respectively.

Next, the two substrate holders 30, which hold the substrates, are gripped at the same time by the first transfer apparatus 142 in the transfer apparatus 140, and housed in the pre-wet module 126. Next, the substrate holders 30, which hold the substrates processed in the pre-wet module 126, are conveyed to the pre-soak module 128 by the first transfer apparatus 142, and, in the pre-soak module 128, an etching process is applied to an oxide film on each of the substrates. Following thereto, the substrate holders 30, which hold the above substrates, are conveyed to the first rinse module 130*a*, and the surfaces of the substrates are rinsed by pure water stored in the first rinse module 130*a*.

The substrate holders 30, which hold the substrates with respect to which the rinsing process applied thereto has been completed, are conveyed from the first rinse module 130*a* to the plating module 110 by the second transfer apparatus 144, and housed in the plating tanks 114 which have been filled with plating liquid. The second transfer apparatus 144 repeats the above procedures sequentially to thereby sequentially house the substrate holders 30, which hold substrates, in the plating tanks 114 in the plating module 110, respectively.

In each of the plating tanks 114, a surface of the substrate is plated by applying a plating voltage between the substrate and an anode (not shown in the figure) in the plating tank 114, and, at the same time, moving the paddle forward and backward, in parallel with the surface of the substrate, by the paddle driver 160 and the paddle follower 162.

After completion of plating, two substrate holders 30, which hold the plated substrates, are gripped at the same time by the second transfer apparatus 144, and conveyed to the second rinse module 130*b*, and the surfaces of the substrates are rinsed by pure water by soaking them in the pure water stored in the second rinse module 130*b*. Next, the substrate holders 30 are conveyed to the blow module 132 by the second transfer apparatus 144, and water droplets remaining on the substrate holders 30 are removed by air-blowing or the like. Thereafter, the substrate holders 30 are conveyed to the load/unload station 120 by the first transfer apparatus 142.

In the load/unload station 120, the processed substrate is taken out from the substrate holder 30 by the transfer robot 122, and conveyed to the spin rinse dryer 106. The spin rinse dryer 106 rotates, at high speed, the plated substrate to thereby dry it. The dried substrate is returned to the cassette 100 by the transfer robot 122.

Figure 2A:
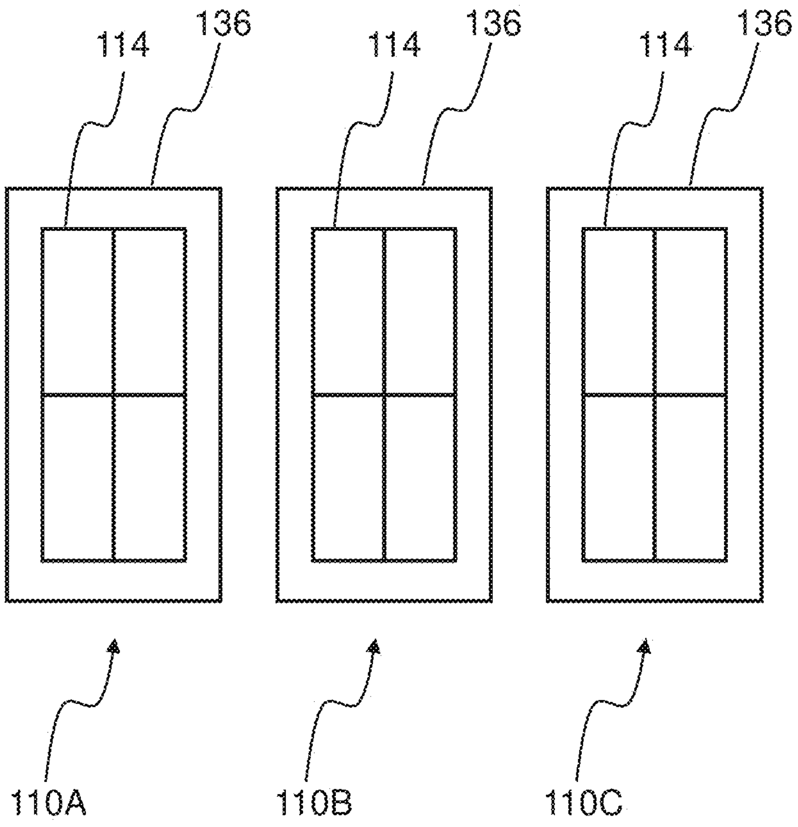
FIG. 2A shows construction examples of plating modules in a plating apparatus.

FIG. 2A shows construction examples of plating modules 110, which are different from those shown in FIG. 1, in the plating apparatus 10. In FIG. 2A, the plating apparatus 10 comprises a first plating module 110A, a second plating module 110B, and a third plating module 110C. Each of the first plating module 110A, the second plating module 110B, and the third plating module 110C has a construction similar to that of the plating module 110 in the plating apparatus 10 in FIG. 1. That is, each of the plating modules 110A, 110B, and 110C comprises an overflow tank 136 and plural plating tanks 114. In the example in FIG. 2A, each of the plating modules (processing modules) 110A, 110B, and 110C comprises four plating tanks 114 (submodules). The first plating module 110A, the second plating module 110B, and the third plating module 110C may be those performing plating processes of the same type (for example, copper plating processes), or may be those performing plating processes of different types, respectively (for example, three types of plating processes such as a copper plating process, a nickel plating process, and a solder (SnAg or the like) plating process). Further, the number of the plating modules included in the plating apparatus 10 and the number of the plating tanks 114 included in a single plating module are not limited to those shown in the example in FIG. 2A, and the numbers may be those optionally selected.

Figure 2B:
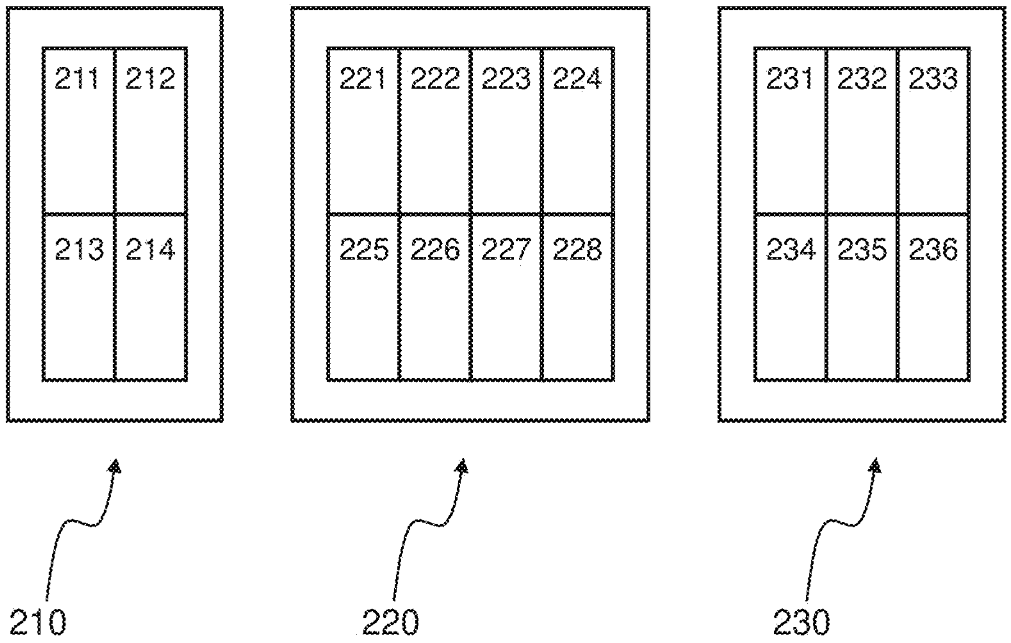
FIG. 2B shows examples of processing modules and submodules in a plating apparatus.

FIG. 2B shows different examples of "processing modules" and "submodules" in the plating apparatus 10. In FIG. 2B, the plating apparatus 10 comprises a first processing module 210, a second processing module 220, and a third processing module 230. Each of the first processing module 210, the second processing module 220, and the third processing module 230 is that corresponding to any one of the pre-wet module 126, the pre-soak module 128, the first rinse module 130*a*, the second rinse module 130*b*, and the plating module 110 in the plating apparatus 10 in FIG. 1. In this regard, it should be reminded that FIG. 2B is that showing three processing modules 210, 220, and 230 only, for convenience of explanation. In the example in FIG. 2B, the first processing module 210 comprises four tanks (submodules) 211-214 which are constructed to have similar constructions, and the same processes may be applied to substrates in the tanks, respectively. That is, the first processing module 210 can perform, in a parallel manner, processing of at most four substrates at the same time, by using the tanks 211-214 at the same time. Similarly, in the example in FIG. 2B, the second processing module 220 comprises eight tanks (submodules) 221-228 which are constructed to have similar constructions, and the third processing module 230 comprises six tanks (submodules) 231-236 which are constructed to have similar constructions. The number of the submodules included in each of the processing modules 210, 220, and 230 is not limited to that shown in the example in FIG. 2B, and the number may be that optionally selected.

Figure 3:
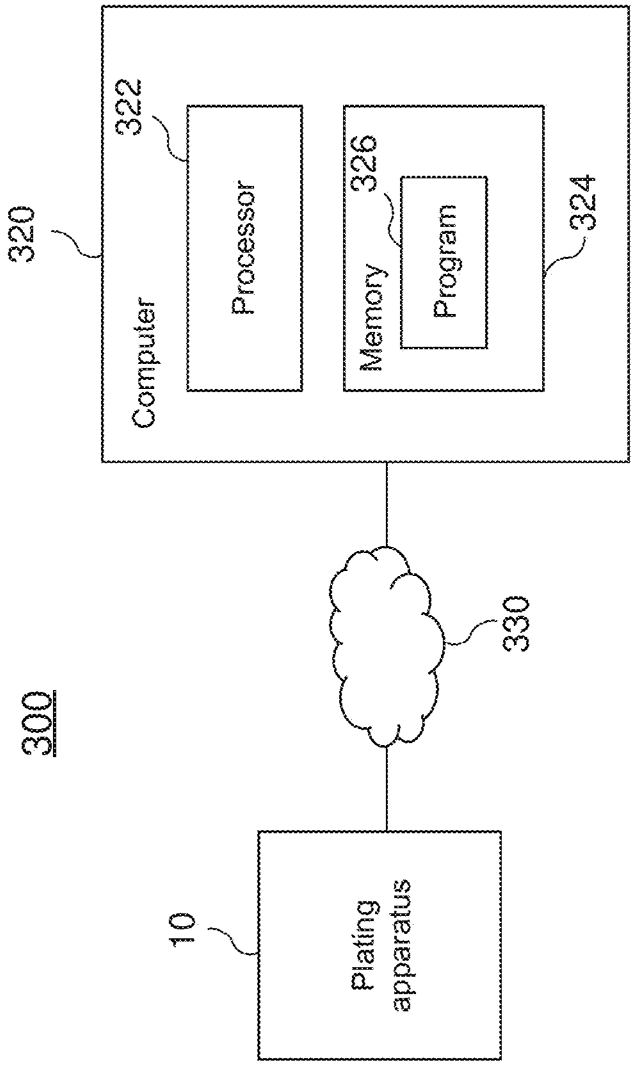
FIG. 3 is a configuration diagram of an example system used for implementing a method according to an embodiment of the present invention.

FIG. 3 is a configuration diagram of an example system 300 used for implementing a method according to an embodiment of the present invention. The system 300 comprises a plating apparatus 10 and a computer 320. The plating apparatus 10 is the plating apparatus which was explained with reference to FIG. 1 or 2. The plating apparatus 10 and the computer 320 are communicably connected with each other via a network 330 such as a LAN (local area network), the Internet, or the like. In a different construction, the computer 320 may be incorporated in the plating apparatus 10 as a part of the construction of the plating apparatus 10. The computer 320 comprises a processor 322 and a memory 324. The memory 324 stores a program 326 which realizes a method according to an embodiment of the present invention. The processor 322 reads the program 326 from the memory 324 and executes it. As a result, the system 300 is made to be able to implement the method according to an embodiment of the present invention. In this regard, although a single computer 320 only is shown in FIG. 3, the system 300 may comprise plural computers 320. In the case of the above construction, memories 324 in the computers 320 may store programs corresponding to parts of the method according to an embodiment of the present invention, respectively; and the processors 322 in the computers 320 may execute the programs, respectively, in such a manner that plural computers 320 cooperate with one another to implement, as a whole, the method according to an embodiment of the present invention.

Figure 4:
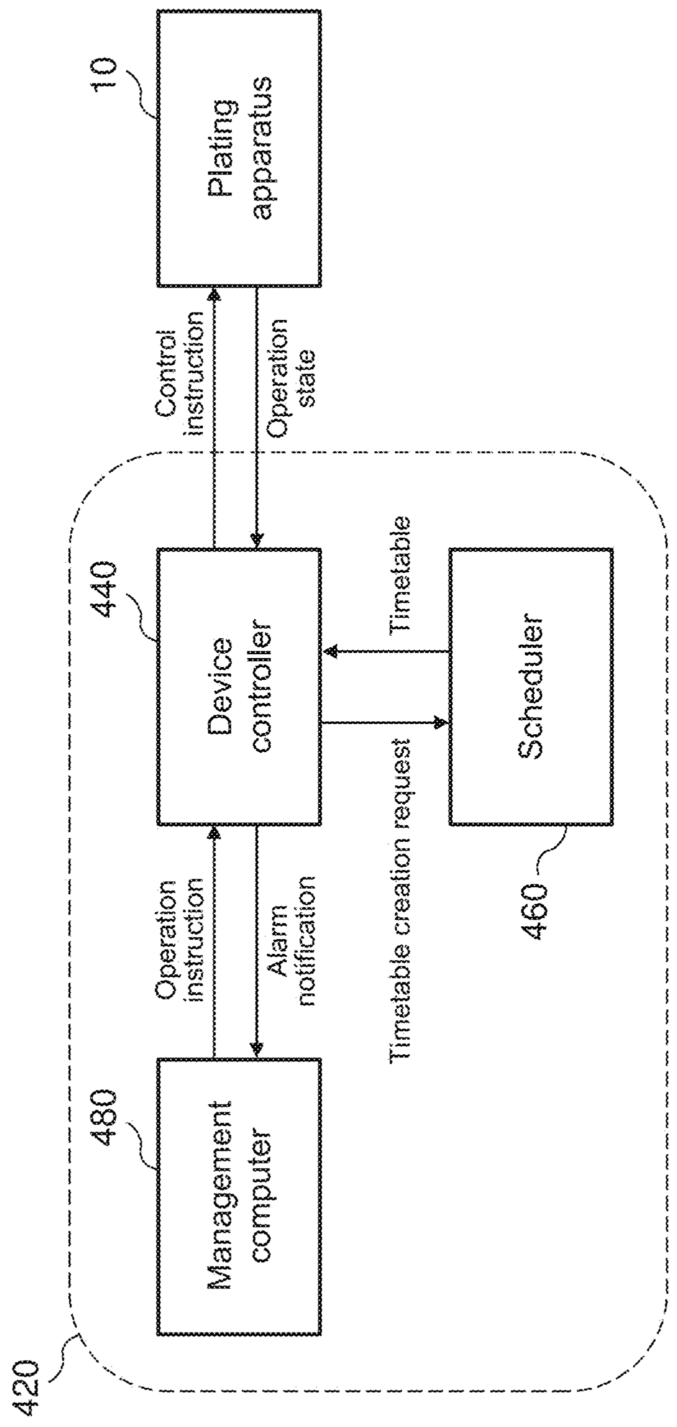
FIG. 4 is a configuration diagram of a different example system used for implementing a method according to an embodiment of the present invention.

FIG. 4 is a configuration diagram of a different example system 400 used for implementing a method according to an embodiment of the present invention. The system 400 comprises a plating apparatus 10 and a group of computers 420. The system 400 comprises the group of computers 420 comprising a device controller 440, a scheduler 460, and a management computer 480. That is, the system shown in FIG. 4 corresponds to an example in the case that the system 300 in FIG. 3 comprises plural computers. Each of the device controller 440, the scheduler 460, and the management computer 480 comprises a processor and a memory similar to those in the computer 320 in the system 300 shown in FIG. 3. In the system 400, the plating apparatus 10, the device controller 440, the scheduler 460, and the management computer 480 are connected with one another via communication paths. In a different construction, a part(s) or the whole of the device controller 440, the scheduler 460, and the management computer 480 is/are incorporated in the plating apparatus 10 as a part of the construction of the plating apparatus 10.

In the system 400 in FIG. 4, the management computer 480 receives an instruction for operation of the plating apparatus 10 from an operator of the system 400 (for example, receiving data input via a user interface), and supplies the operation instruction to the device controller 440. The operation instruction comprises various kinds of parameters for designating conditions of a paltering process in the plating apparatus 10, various kinds of setting values for respective parts in the plating apparatus 10, and/or instruction information relating to control of operation of the plating apparatus 10, and so on.

The device controller 440 transmits a request for creation of a timetable to the scheduler 460, and, in response thereto, the scheduler 460 creates a timetable and supplies it to the device controller 440. The timetable creation request is transmitted, before a start of operation of the plating apparatus 10, from the device controller 440 to the scheduler 460 in accordance with an operation instruction from the management computer 480. Further, the timetable creation request is transmitted from the device controller 440 to the scheduler 460, when a failure has occurred in the plating apparatus 10 during operation thereof for performing action corresponding to the failure.

The device controller 440 transmits, according to the timetable, control instructions for controlling respective parts of the plating apparatus 10. The plating apparatus 10 outputs, to the device controller 440, information relating to states of operation of the respective parts (for example, information representing occurrence of a failure). The device controller 440 communicates, according to the state, an alarm (for example, occurrence of a failure) to the management computer 480.

Figure 5:
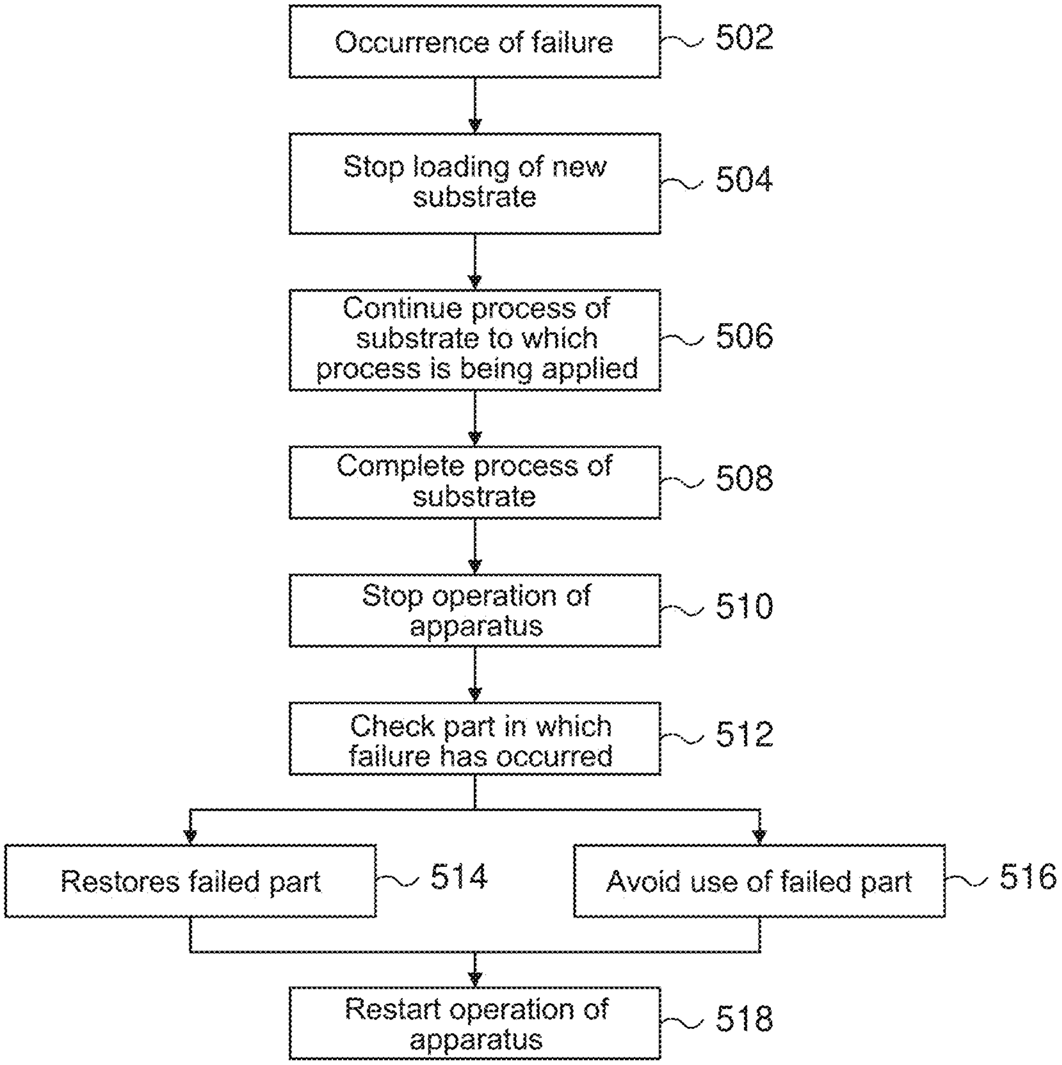
FIG. 5 shows an operation flow that shows a prior-art procedure performed when a failure has occurred in a plating apparatus.

FIG. 5 shows an operation flow that shows a prior-art procedure performed when a failure has occurred in the plating apparatus 10. At the time when a failure has occurred in the plating apparatus 10 (502), loading of a new substrate is stopped (504). That is, the process for taking a new substrate out of the cassette 100 and conveying the new substrate to the load/unload station 120 is stopped. With respect to a substrate which is being processed in the plating apparatus 10 at the time when a failure has occurred, the process that is being applied to the substrate will be continued if the process can be continued (506). For example, in the case that the plating module 110 comprises eight plating tanks 114 like the case of the plating apparatus 10 in the example in FIG. 1 and that a failure has occurred in only one of the plating tanks 114 and the remaining seven plating tanks 114 are in good condition, the processes performed in the remaining seven plating tanks 114 are continued. After completion of a process that is being applied to a substrate since the time before occurrence of such a failure (508), operation of the whole plating apparatus 10 is stopped (510).

After stopping operation of the plating apparatus 10, a maintenance person checks a part in which the failure has occurred (512), and restores the failed part (514) by replacing a component which is the cause of the failure, or the like, for example. If a long period of time is required for completing restoration, it may be possible to select an option such that restoration is deferred and the plating apparatus 10 is operated without using the failed part (516). For example, in the above-explained example, the plating module 110 may be operated in such a manner that use of the failed single plating tank is discontinued and the remaining seven plating tanks are used. After completing restoration of the failed part (514), or after completing setting of the plating apparatus 10 to make the plating apparatus 10 avoid using the failed part if restoration thereof is to be deferred (516), operation of the plating apparatus 10 is restarted (518). In the case that operation is restarted without using the failed part, the throughput of the plating apparatus 10 (processing capacity per unit time) will decreases; however, long suspension of operation of the whole plating apparatus 10 can be avoided.

However, in the case that operation is performed in accordance with the operation flow shown in FIG. 5, processing of a new substrate does not start during a period from the time when loading of the new substrate is stopped (504) to the time when operation of the plating apparatus 10 is stopped (510); thus, there is a problem that downtime corresponding to the above period occurs and the rate of operation of the plating apparatus 10 is lowered accordingly.

Figure 6:
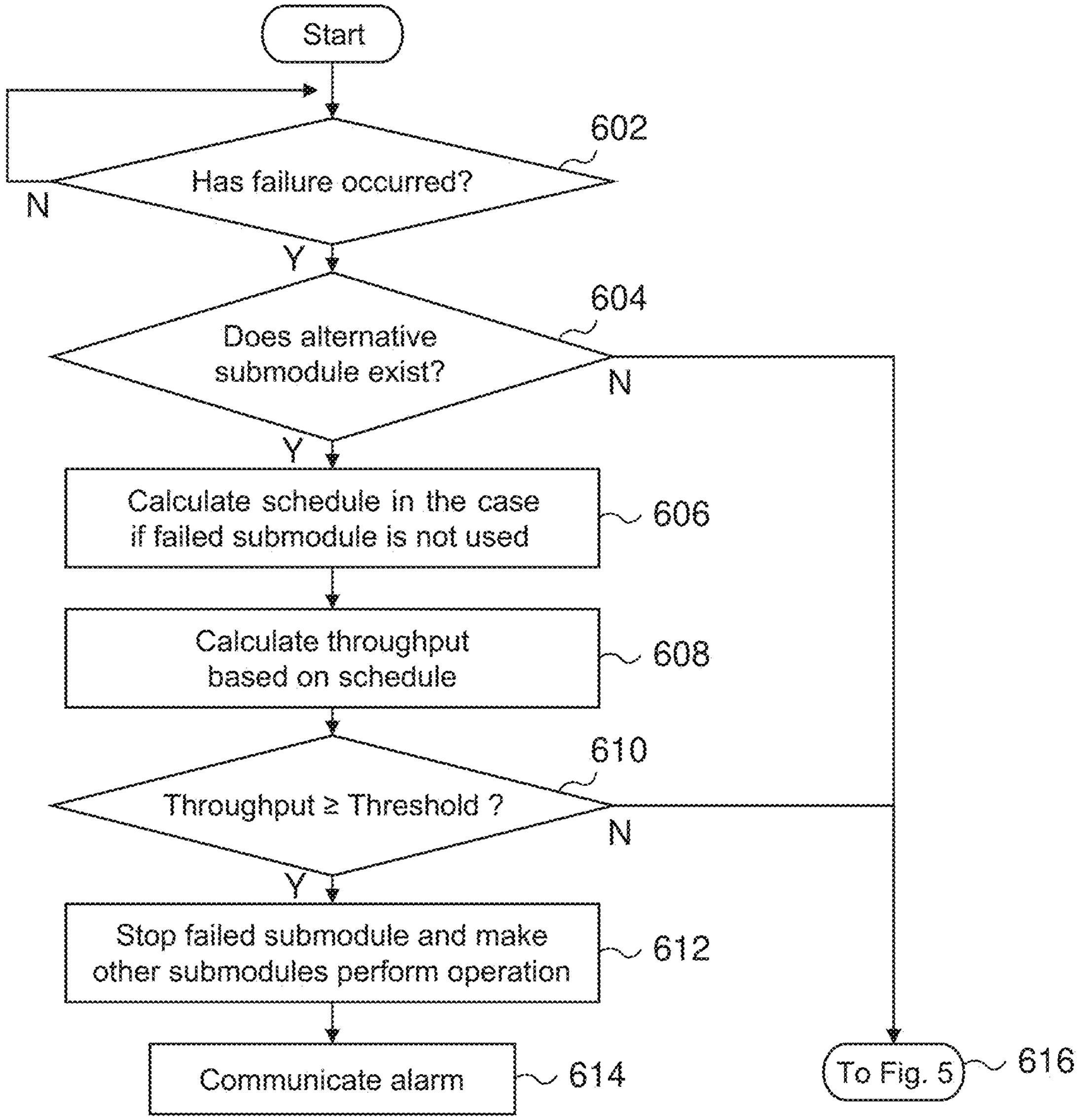
FIG. 6 is a flow chart showing operation of a system used for implementing a method according to an embodiment of the present invention.

FIG. 6 is a flow chart showing operation of a system 300 or 400 used for implementing a method according to an embodiment of the present invention. The processes in the respective steps in the flow chart in FIG. 6 are performed by a processor. In the following explanation, unless otherwise specified, the "processor" refers to the processor 322 in the computer 320 shown in FIG. 3, or any of appropriate processors in the device controller 440, the scheduler 460, and the management computer 480 shown in FIG. 4. The method according to the embodiment in FIG. 6 starts from step 602, during the time when plating apparatus 10 is being operated normally.

In step 602, the processor judges whether a failure has occurred in the plating apparatus 10. More specifically, the processor judges whether a failure has occurred in at least one submodule in plural submodules which are components of the plating apparatus 10. For example, the device controller 440 continuously receives, at predetermined intervals, from respective processing modules, i.e., the pre-wet module 126, the pre-soak module 128, the first rinse module 130*a*, the second rinse module 130*b*, and the plating module 110, in the plating apparatus 10, information relating to operation states (for example, data of current, voltages, temperature, and so on) of them. As shown in FIGS. 2A and 2B, each of the processing modules comprises plural submodules. Thus, the device controller 440 continuously monitors the operation state of each of the plural submodules in the plating apparatus 10. The processor in the device controller 440 can perform judgment as to whether a failure has occurred in each of the submodules, based on change in the operation state (for example, change in the current value) of the submodule. In a different construction, each of the submodules may directly send an alarm signal indicative of occurrence of a failure to the device controller 440, and the processor in the device controller 440 may judge whether it has received such an alarm signal.

If a failure has occurred in one of submodules in the plating apparatus 10, the processor performs, in next step

604, judgment as to whether an alternative submodule that can be used in place of the failed submodule exists. The alternative module is a submodule which has a function identical with that of the failed submodule (that is, which can perform the same process) and is not in a failed state. That is, the processor performs judgment as to whether a processing module, which includes the submodule in the failed state, includes a submodule which is not in a failed state. For example, in the example in FIG. 2B, in the case that a failure has occurred only in the submodule 211 in the four submodules 211-214 in the first processing module 210, the remaining three submodules 212-214 can perform, in place of the submodule 211, the process that is performed by the submodule 211. On the other hand, in the case that failures have occurred in all the submodules 211-214, no alternative submodule will exist and the first processing module 210 cannot continue its operation.

In the case that an alternative submodule exists, the process proceeds to step 606. In step 606, the processor recalculates an operation schedule of the plating apparatus 10, i.e., an operation schedule in the case that it is assumed that a failed submodule is unusable. For example, before a start of operation of the plating apparatus 10, the processor in the scheduler 460 has already created a timetable of the plating apparatus 10, i.e., a timetable in the condition that no failure has occurred in the plating apparatus 10 and all submodules in the plating apparatus 10 are usable. The timetable is information representing an operation schedule including information such as when each of parts in the plating apparatus 10 will be operated to perform a process, to which substrate the process will be applied, and what kind of process the part will perform. The plating apparatus 10 performs operation according to a timetable which has been created in advance. During operation, if a failure has occurred in the plating apparatus 10, the processor in the scheduler 460 creates a timetable in step 606, i.e., in this time, a timetable in the condition that using of the failed submodule is to be stopped and using of all other submodules, which are not in failed states, is to be continued. In this regard, the above newly created timetable is a tentative timetable, and operation of the plating apparatus 10 based on the above newly created timetable is not performed at this point in time.

Next, in step 608, the processor calculates, based on the schedule (timetable) created in step 606, the throughput of the plating apparatus 10. That is, the processor calculates the throughput of the plating apparatus 10 in the state that the plating apparatus 10 performs operation without using the failed submodule. The throughput of the plating apparatus 10 is an index representing processing capacity per unit time of the plating apparatus 10, and, for example, may be defined as the number of substrates which can be produced by the plating apparatus 10 (i.e., the number of substrates with respect to each of which all processing steps in a series of processing steps performed in the plating apparatus 10 have been completed) during unit time. As explained above, the timetable comprises information such as when each of parts in the plating apparatus 10 will be operated to perform a process, to which substrate the process will be applied, and what kind of process the part will perform, so that the processor (for example, the processor in the scheduler 460 or the device controller 440) can calculate the throughput by analyzing the timetable.

In this regard, instead of obtaining the throughput of the plating apparatus 10 by performing calculation such as that performed in step 608, the throughput may be obtained by performing an experiment, for example, an experiment wherein the plating apparatus 10 is operated for a period of time in the state that using of a submodule in a failed state is stopped, and the throughput is measured during the above period of time.

Next, in step 610, the processor performs judgment as to whether the throughput calculated in step 608 is larger than a predetermined threshold value. If the throughput is larger than the predetermined threshold value, the process proceeds to step 612, and the processor controls the respective parts of the plating apparatus 10 to make them perform operation based on the timetable created in step 606. That is, for example, in step 612, the processor in the device controller 440 provides the plating apparatus 10 with an instruction to operate it in such a manner that the submodule in the failed state stops its operation and the submodules other than the above submodule perform their operation. Thus, in the case that the throughput calculated in step 608, that is, the throughput obtainable in the condition that the submodule in the failed state is not used, is sufficiently large, operation of the plating apparatus 10 using submodules except for the failed submodule is continued, instead of stopping operation of the whole plating apparatus 10. Thus, according to the method of the present embodiment, there is no period of time during that a start of processing of a new substrate is suspended, such as a period of time from the time when loading of a new substrate is stopped (504) to the time when operation of the plating apparatus 10 is stopped; accordingly, higher throughput can be realized.

It is preferable that the threshold value used in judgment in above step 610 be set to a value corresponding to each of contents of failures. For example, it is preferable that a small threshold value be assigned to a failure with respect to that the length of time required for restoration is long, and that a large threshold value be assigned to a failure with respect to that the length of time required for restoration is short. For example, the threshold value may be a value that represents throughput that is obtained by considering total operation that includes a period of time during that operation is stopped, such as a period of time from the time when the whole plating apparatus 10 is stopped to restore a failed submodule to the time when operation of the plating apparatus 10 in a perfect condition is restarted. The following formula is an example of the above.

$$\text{Threshold value} = N \times (T - t_k)/T$$

In the above formula, N denotes the throughput of the plating apparatus 10 before occurrence of a failure (i.e., the number of substrates that can be processed during unit time); T denotes the length of a predetermined judgment period; and $t_k$ denotes an expected length of time required for restoration, wherein the expected length of time is defined in advance to correspond to each failure mode k (each of the kinds of failures) or each submodule k (k=1, 2, . . . ). FIG. 7 is a table showing examples of time $t_k$ required for restoration. The length of time required for restoration may be time required for completing work for replacing a component in a failed submodule, or the like. The judgment period is a period having a predetermined length of time that has been determined in advance for judgment in step 610, and may be a period of time until the time when the next scheduled maintenance of the plating apparatus 10 is to be performed, for example. A table of the lengths of time required for restoration $t_k$ such as that shown in FIG. 7 and information of the lengths of the judgment periods may be determined in advance by a system administrator of the system 300 or 400 and stored in a storage device (a memory) in the device controller 440. For example, if it is supposed that N=50 (pieces/time) and the remaining time until the next scheduled maintenance of the plating apparatus 10 is 72 hours (i.e., T=72 (hours)), and that the failure mode 1 in the example in FIG. 7 (t1=3 (hours)) has occurred in the plating apparatus 10, the processor in the device controller 440 calculates the threshold value as shown below:

$$\text{Threshold value}=50\times(72-3)/72=47(\text{pieces/time})$$

and uses the above threshold value in judgment in step 610. In the present case, if the throughput calculated in step 608, i.e., the throughput in the condition that the failed submodule is not used, is larger than the above threshold value, i.e., the numerical value 47, it is determined that it is efficient if the failed submodule is controlled to stop its operation and the plating apparatus 10 is controlled to perform operation. Accordingly, it becomes possible to make the plating apparatus 10 perform operation by using a more efficient method, as a result that step 612 is performed in accordance with result of judgment in step 610.

In this regard, step 612 may be set in such a manner that it is performed only when a predetermined condition is met. For example, step 612 may be performed only when a manager or a maintenance person of the system 300 or 400 is absent (for example, at night or the like).

In step 614 that is subsequent to step 612, the processor performs a notification process for communicating an alarm that represents a state that operation of the plating apparatus 10 is being continued without using one or more failed submodules. For example, the processor in the management computer 480 outputs an alarm similar to that explained above to a user interface (for example, an operation screen for an operator) in the management computer 480. As a result, for example, during the period when operation of the plating apparatus 10 is being continued, a maintenance person in charge of the plating apparatus 10 is allowed to prepare a replacement component which is to be used in the failed submodule.

On the other hand, if it is judged in step 610 that the throughput is smaller than the predetermined threshold value, the process proceeds to step 616. In the case that the calculated throughput is smaller than the predetermined threshold value, it is determined that it is inefficient if operation similar to the operation in step 612 is performed, i.e., if operation of the plating apparatus 10 is continued by using some submodules, which are not in failed states, only. Thus, in step 616, the respective steps in the operation flow shown in FIG. 5 are performed; so that, after stopping operation of the whole plating apparatus 10 (510), restoration of the failed part (514) and so on is performed.

In the above description, embodiments of the present invention have been explained based on some examples; and, in this regard, the above explained embodiments of the present invention are those used for facilitating understanding of the present invention, and are not those used for limiting the present invention. It is obvious that the present invention can be changed or modified without departing from the scope of the gist thereof, and that the present invention includes equivalents thereof. Further, it is possible to arbitrarily combine components or omit a component(s) disclosed in the claims and the specification, within the scope that at least part of the above-stated problems can be solved or within the scope that at least part of advantageous effect can be obtained.

REFERENCE SIGNS LIST

10 Plating apparatus
30 Substrate holder
100 Cassette
102 Cassette table
104 Aligner
106 Spin rinse dryer
110 Plating module
110A First plating module
110B Second plating module
110C Third plating module
114 Plating tank
120 Load/unload station
122 Transfer robot
124 Stocker
126 Pre-wet module
128 Pre-soak module
130*a* First rinse module
130*b* Second rinse module
132 Blow module
136 Overflow tank
140 Transfer apparatus
142 First transfer apparatus
144 Second transfer apparatus
150 Rail
152 Loading plate
160 Paddle driver
162 Paddle follower
210 First processing module
211-214 Tank (Submodule)
220 Second processing module
221-228 Tank (Submodule)
230 Third processing module
231-236 Tank (Submodule)
300 System
320 Computer
322 Processor
324 Memory
326 Program
330 Network
400 System
420 Group of computers
440 Device controller
460 Scheduler
480 Management computer

What is claimed is:

1. A method for controlling operation of a semiconductor manufacturing apparatus, which comprises one or plural processing modules which respectively comprise plural submodules, comprising steps for:

judging whether a failure has occurred in at least one of the plural submodules;

judging, in the case that a failure has occurred in at least one of the plural submodules, whether at least one submodule which is not in a failed state exists in a processing module to which the failed submodule belongs;

obtaining, in the case that at least one submodule which is not in a failed state exists in the processing module to which the failed submodule belongs, throughput in a state that the one or plural processing modules are controlled to perform operation while the failed submodule is controlled to stop its operation;

judging whether the throughput is larger than a predetermined threshold;

continuing operation of the one or plural processing modules while controlling the failed submodule to stop its operation, in the case that the throughput is larger than the predetermined threshold; and stopping operation of the whole semiconductor manufacturing apparatus for restoration from the failure, in the case that the throughput is smaller than the predetermined threshold.

2. The method as recited in claim 1, wherein the threshold value is calculated based on restoration time that is defined in advance with respect to each of failure modes.

3. The method as recited in claim 2, wherein the threshold value is calculated by adjusting, based on a ratio between the length of a predetermined judgment period and the length of restoration time corresponding to the occurred failure, a value of throughput before occurrence of a failure.

4. The method as recited in claim 3, wherein the predetermined judgment period is a period relating to maintenance that is periodically performed with respect to the semiconductor manufacturing apparatus.

5. The method as recited in claim 1, wherein the step for obtaining throughput in a state that the one or plural processing modules are controlled to perform operation while the failed submodule is controlled to stop its operation comprises steps for:

creating a schedule for processing of plural objects by the semiconductor manufacturing apparatus, on the supposition that the one or plural processing modules are controlled to perform operation while the failed submodule is controlled to its stop operation; and calculating the throughput based on the created schedule, wherein the throughput represents the number of the objects with respect to which processing applied thereto in the semiconductor manufacturing apparatus is to be completed within unit time.

6. The method as recited in claim 1 further comprising a step for communicating an alarm that represents a state that operation of the one or plural processing modules is continued while the failed submodule is controlled to stop its operation.

7. The method as recited in claim 1 further comprising a step for selecting, based on a predetermined condition, whether the step for continuing is to be performed.

8. The method as recited in claim 1, wherein the processing module is a plating module comprising plural plating tanks; and the submodules are the plating tanks.

9. A semiconductor manufacturing apparatus comprising:

one or plural processing modules, wherein each processing module comprises plural submodules; and a controller constructed to control operation of the one or plural processing modules in accordance with the method recited in claim 1.

* * * * *